United States Patent
Drumm et al.

(10) Patent No.: US 6,643,683 B1
(45) Date of Patent: Nov. 4, 2003

(54) INTERACTIVE CLIENT-SERVER ENVIRONMENT FOR PERFORMING COLLABORATIVE TIMING ANALYSIS OF CIRCUIT DESIGNS

(75) Inventors: Anthony DeGroff Drumm, Rochester, MN (US); Mark S Fredrickson, Rochester, MN (US); Marcus Matthew Poplawski, Minneapolis, MN (US); Brian Christopher Wilson, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/566,869

(22) Filed: May 8, 2000

(51) Int. Cl.[7] ................................................ G06F 15/16
(52) U.S. Cl. ........................ 709/203; 709/224; 709/225; 709/235; 709/217; 709/218; 717/100; 717/104; 716/4; 716/5; 716/6; 703/19
(58) Field of Search .......................... 709/203, 224–225, 709/235, 217–218; 717/100, 104; 716/4–6; 703/19

(56) References Cited

U.S. PATENT DOCUMENTS 4,744,084 A * 5/1988 Beck et al. ..................... 716/6
5,796,952 A * 8/1998 Davis et al. ................. 709/224
6,438,592 B1 * 8/2002 Killian ........................ 709/224
6,446,109 B2 * 9/2002 Gupta ......................... 709/205

* cited by examiner

Primary Examiner—Robert B. Harrell
Assistant Examiner—Hien Le
(74) Attorney, Agent, or Firm—Wood, Herron & Evans, LLP (57) ABSTRACT

An apparatus, program product and method utilize an interactive request server program to interface a plurality of client computers with a timing analysis program. The interactive request server program receives client requests from the plurality of client computers over a network, and, in response to each client request, accesses the timing analysis program to retrieve timing data based upon such client request and thereafter forwards the timing data to the client computer making such request. The interactive request server program may optionally be implemented using a web server program and an application server program, with the web server program interfacing with the client computers via an Internet-type interface, and the application server program interfacing with the timing analysis program using a programmatic interface supported by the timing analysis program. The web server, program and the application server program interface with one another through the use of scripts, which are executed by the web server in response to client requests, and which generate one or more commands that are issued to the application server program to control the timing analysis program via the programmatic interface.

31 Claims, 7 Drawing Sheets

| PIN NAME | SLACK | SLEW | DELAY | TOTAL DELAY |
|---|---|---|---|---|
| PIN1 | -0.45 | 2.49 | 0.70 | 0.7 |
| PIN2 | -0.40 | 2.26 | 0.40 | 1.1 |
| PIN3 | -0.40 | 2.49 | 0.90 | 2.0 |
| PIN4 | -0.55 | 2.17 | 0.70 | 2.7 |

FIG. 9

INTERACTIVE CLIENT-SERVER ENVIRONMENT FOR PERFORMING COLLABORATIVE TIMING ANALYSIS OF CIRCUIT DESIGNS

FIELD OF THE INVENTION

The invention is generally related to timing analysis of logic models, e.g., for integrated circuit designs and the like. In particular, the invention is related to accessing and manipulating timing data generated by a timing analysis engine or program.

BACKGROUND OF THE INVENTION

Electronic circuits have become significantly more complex as circuit fabrication technologies have improved. It is not uncommon for electronic circuits to incorporate multiple integrated circuits, or chips, packaged together on printed circuit boards and/or advanced packages, and interconnected by hundreds of signal paths. Furthermore, each integrated circuit may literally include millions of logic gates and interconnects integrated onto a single piece of silicon substrate the size of a fingernail. In addition, often the same functionality that required multiple chips can be integrated onto the same chip, a concept often referred to as "system-on-chip" technology.

The design of electronic circuits has likewise become more difficult as complexity has increased. Complex circuits, for example, are often designed by teams of designers. Different designers are typically given responsibility to design different functional blocks of a circuit, with the final design incorporating the functional blocks into a single integrated design. Testing of such circuit designs is also an important aspect of the design process, since each functional block often must be tested separately to insure correct functional operation, as well as collectively with the other functional blocks to ensure correct functional operation of the overall design.

Various computer software applications, commonly known as "tools", have been developed to assist in the design of electronic circuits. One such tool is a timing analysis program, or "engine", which is used to calculate expected delays along signal paths in a circuit design to assist in identifying timing problems such as race conditions or early or late arrival of signals relative to other signals. A timing analysis program is typically a stand-alone application that is accessible by a single user, and that typically operates on a logical model of a circuit design, incorporating netlists of components and interconnections, to determine the amount of delay through different paths in a circuit design. Further, a number of timing analysis programs are provided with interactive capabilities such that a user is able to interactively modify timing parameters and options, request other timing data, modify report formats, etc. while performing timing analysis on a logic design.

Given the complexity of modem circuit designs, timing analysis presents a number of obstacles to the design process. For example, for complex designs, the amount of timing data generated by a timing analysis program is often beyond the capabilities of a conventional desktop computer or workstation, both in terms of storage requirements and processing power, such that a large multi-user computer such as a server is required to run a timing analysis program on a complex design. Even when run on a high performance computer, timing analysis of a complex circuit may take several hours, and generate hundreds of megabytes of data.

For these reasons, often a timing analysis program is run in a non-interactive batch job overnight to minimize disruptions and reduced computer performance during the day.

Moreover, when a circuit design is being developed by a team of designers, it may be desirable for multiple designers to access the same timing data, so that the different designers can test different parts of the design and thus collaborate in the overall timing verification of the design. Traditionally, however, access to timing data generated by a timing analysis program is limited to one user at a time. Multiple users may instead run separate timing analysis programs on different computers to concurrently access timing data, but doing so requires multiple high performance computers, which is an inefficient allocation of computer resources, and may be beyond the resources of many enterprises.

As discussed above, timing analysis may be performed in a batch job to generate a large, omnibus report. In some instances, multiple users may be permitted to access the resulting report at the same time. However, when a designer is only interested in working with a small portion of a design, the vast majority of information in an omnibus report is irrelevant, which makes it difficult to sort through the report to find the information of interest. Furthermore, the size of an omnibus report often exceeds the capacities of many editors used on single-user computers. In addition, often to keep the size of an omnibus report manageable, some paths in the circuit design may not be analyzed, and often a designer will need timing data for some of these unanalyzed paths. As a result, additional timing analysis is often required after analysis of an omnibus report.

Another difficulty presented by batch processing of a circuit design is the lack of interactivity for users. A report, once generated, only provides timing data for a specific set of circumstances set forth by a designer when setting up the timing analysis program to perform timing analysis. Other designers may require other timing data, or may require different timing parameters to be used when generating the data. Changes to parameters and other options typically require new data to be generated. As a result, modifying timing analysis parameters, fixing errors, etc., becomes a time consuming and cumbersome process.

A significant need has therefore developed in the art for a manner of facilitating the performance of timing analysis on complex circuit designs, and in particular, to facilitate collaborative timing analysis of such circuit designs by multiple circuit designers.

SUMMARY OF THE INVENTION

The invention addresses these and other problems associated with the prior art by providing an apparatus, program product and method in which an interactive request server program is utilized to interface a plurality of client computers with a timing analysis program. The interactive request server program receives client requests from the plurality of client computers over a network, and, in response to each client request, accesses the timing analysis program to retrieve timing data based upon such client request and thereafter forwards the timing data to the client computer making such request. By using the interactive request server program as an interface to the timing analysis program, interactive timing analysis, and if desired, collaborative timing analysis, may be performed on a logic model by multiple clients or users, and often with less computer resources than would otherwise be required.

In some embodiments of the invention, the interactive request server program may be implemented using a web server program and an application server program, with the web server program interfacing with the client computers via an Internet-type interface, and the application server program interfacing with the timing analysis program using a programmatic interface supported by the timing analysis program. The web server program and the application server program interface with one another through the use of scripts, which are executed by the web server in response to client requests, and which generate one or more commands that are issued to the application server program to control the timing analysis program via the programmatic interface. Through the use of an Internet-type interface, clients operating on a wide variety of platforms, and interfaced over a wide variety of networks, may be supported with less difficulty, and often with commercially-available client software (e.g., a conventional web browser). However, it will be appreciated by one of ordinary skill in the art having the benefit of the instant disclosure that other implementations of an interactive request server program may be used in the alternative, and the invention is therefore not limited to an Internet-type interface.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Hardware and Software Environment

Figure 1:
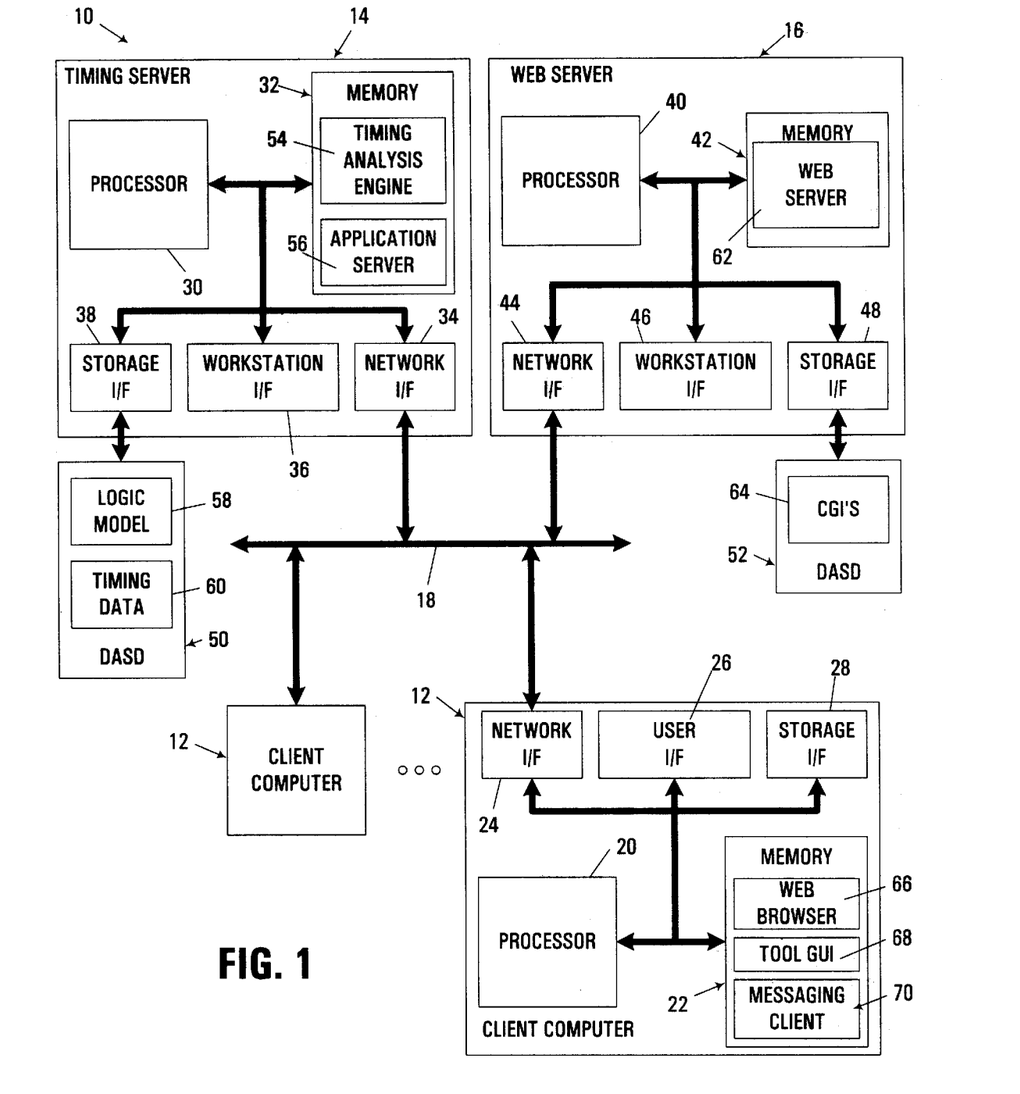
FIG. 1 is a block diagram of a networked computer system for performing interactive client-server based timing analysis consistent with the invention.

Turning to the Drawings, wherein like numbers denote like parts throughout the several views, FIG. 1 illustrates a computer system 10 consistent with the invention. Computer system 10 is illustrated as a networked computer system including one or more client computers 12 coupled to a timing server computer 14 and a web server computer 16 over a network 18. Network 18 may represent practically any type of networked interconnection, including but not limited to one or more local-area, wide-area, wireless, and public networks (e.g., the Internet). Moreover, any number of additional computers and other devices may be networked through network 18. Each of computers 12, 14, and 16, as well as the overall networked computer system 10, may be considered to be an apparatus as the term is used herein. However, it should be appreciated the term "apparatus" may also include other suitable programmable electronic devices consistent with the invention.

Each of computers 12, 14 and 16 may represent practically any type of computer, computer system or other programmable electronic device, although in the illustrated embodiment, each client computer is implemented as a single-user computer such as a desktop computer, a workstation, a portable computer, etc., while each of computers 14, 16 is implemented as a multi-user computer such as a PC-based server, a minicomputer, a midrange computer, a mainframe computer, etc. Each of computers 12, 14 and 16 typically includes a processor interfaced with a memory and a plurality of peripheral components.

For client computer 12, for example, a processor 20 is interfaced with a memory 22 and a plurality of interface modules, e.g., a network interface 24 (for interfacing client computer 12 with network 18), a user interface 26 (for receiving input and displaying information to a user, e.g., a display, keyboard, mouse and/or other user input device) and a storage interface 28 (for interfacing with an external storage device). Likewise, timing server computer 14 includes a processor 30 interfaced with a memory 32, a network interface 34, a workstation interface 36 (for interfacing with one or more workstations), and a storage interface 38 (for interfacing with a Direct Access Storage Device (DASD) 50). Web server computer 16 includes a processor 40 interfaced with a memory 42, a network interface 44, a workstation interface 46, and a storage interface 48 (for interfacing with a DASD 52).

Each processor 20, 30, 40 typically includes one or more microprocessors, and each memory 22, 32, 42 typically includes the random access memory (RAM) devices comprising the main storage for the respective computer, as well as any supplemental levels of memory, e.g., cache memories, non-volatile or backup memories (e.g., programmable or flash memories), read-only memories, etc. In addition, each memory may be considered to include memory storage physically located elsewhere in the respective computer, e.g., any cache memory in the associated processor, as well as any storage capacity used as a virtual memory, e.g., as stored on an external storage device or on another computer accessible via network 18.

Each computer 12, 14, 16 operates under the control of an operating system, and executes or otherwise relies upon various computer software applications, components, programs, objects, modules, data structures, etc. For implementing interactive client-server based timing analysis, for example, timing server computer 14 utilizes a timing analysis engine (or program) 54 and application server program 56, shown resident in memory 32, as well as a logic model 58 and stored timing data 60, shown resident in DASD 50. Web server computer 16 likewise utilizes a web server program 62, shown resident in memory 42, and a set of common gateway interface (CGI) programs 64, shown resident in DASD 52. Client computer 12 utilizes a web browser program 66, a tool GUI program 68, and a messaging client program 70, shown resident in memory 22.

Moreover, various applications, components, programs, objects, modules, etc. may also execute on one or more processors in another computer coupled to the respective computers via network 18, e.g., in a distributed computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions will be referred to herein as "computer programs", or simply "programs". The computer programs typically comprise one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Interactive Client-Server Based Timing Analysis

Figure 2:
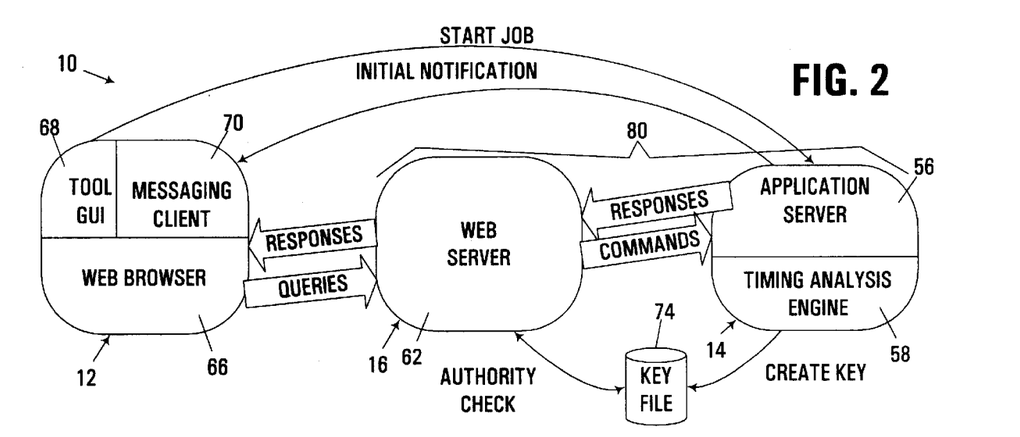
FIG. 2 is a block diagram illustrating the flow of information between a client, web server and application server in the networked computer system of FIG. 1.

FIG. 2 illustrates the flow of information between a client computer 12 and server computers 14, 16 during an interactive client-server based timing analysis session. Illustrated within client computer 12 is web browser 66, tool GUI program 68 and messaging client program 70.

Web browser 66 may be implemented using any known Internet-type browser, such as Microsoft Internet Explorer or Netscape Navigator, among others. If an Internet-type interface is not used, however, other user interface models, including text and/or graphical user interface models, whether open or proprietary, may be used, whereby browser 66 would be configured to provide the desired user interface and appropriate communications protocol to communicate with the client server environment.

Tool GUI program 68 is an application utilized to launch a timing analysis job on application server 56 as will be discussed in greater detail below. The tool GUI program may be a separate application, or in the alternative, may be integrated into another electronic design automation (EDA) application, e.g., to provide a button, menu selection, etc., that starts a job on the application server. The functionality of the tool GUI program may also be integrated into browser 66 if desired.

Messaging client program 70 is typically implemented using an application suitable for alerting the user of the client computer of a message from the application server 56, indicating that the timing analysis engine has completed an analysis operation and is ready to receive input. Messaging client program 70 may utilize any number of protocols, including various proprietary protocols or various open protocols, e.g., the instant messaging protocols available from America Online, Microsoft, and ICQ, among others. Messaging client program 70 may also be incorporated into groupware or electronic messaging environments such as Lotus Domino or various known electronic mail packages. Among other capabilities, program 70 is configured to receive an initial notification message from the application server indicating that the timing analysis engine has completed analysis on a logic model and is ready to interact with the client. Accordingly, any number of electronic messaging formats may be utilized consistent with the invention. Moreover, the functionality of program 70 may also be incorporated into browser 66. Other manners of electronically notifying a client over a network may also be used.

An interactive request server 80, comprised in the illustrated implementation of web server application 62 and application server program 56, is utilized to facilitate interactive communication between one or more client computers 12 and timing analysis engine 58. In this regard, web server program 62 is typically configured to receive hypertext transfer protocol (HTTP) requests to communicate with web browser program 66 in a manner well known in the art. Web program server 62 then reformats the requests in a format suitable for processing by application server program 56. In the illustrated implementation, web server program 62 is implemented using a conventional Internet-based web server such as the Apache server, with control over application server program 56 performed via the execution of common gateway interface (CGI) programs by web server program 62 in a manner well known in the art. Typically, such CGI programs are implemented as CGI-BIN (binary) scripts, which generate one or more commands for the application server in response to an HTTP-compatible request issued by a client computer. In response, the application server program 56 interprets the request and controls the timing analysis engine 58 based upon the specific programmatic interface supported by the engine. Web server program 62 and application server program 56 may communicate in any number of protocols, so long as the commands provided to the application server provide sufficient information for performing the desired operations on the timing analysis engine.

In the illustrated implementation, timing analysis engine 58 may be implemented using the Eins Timer timing analysis engine available from International Business Machines Corporation, which is provided as a component of the BooleDozer synthesis engine. Such a timing analysis engine supports a programmatic interface in the tool control language (TCL) scripting language. TCL supports control commands for timing analysis engines and other tools, and includes integrated networking capabilities. In the illustrated implementation, therefore, application server program 56 is configured as a TCL interpreter executing on the timing analysis engine 58. Moreover, the CGI scripts executed by web server program 62 include embedded TCL commands that are processed by application server program 56 and passed to timing analysis engine 58 to handle the commands. Application server program 56 is also capable of receiving the timing data generated by engine 58 and transmitting the raw data to web server program 62 for formatting and transmission to browser 66. Both CGI scripting and TCL scripting are known in the art, and as such, the implementation of the functionality described herein in such an environment is within the abilities of one of ordinary skill in the art having the benefit of the instant disclosure. Other programmatic interfaces, e.g., Application Program Interfaces (API's) supported by various operating systems, distributed objects such as ActiveX controls, Java Beans, etc., may also be used in the alternative.

It will be appreciated that different communication protocols, commercial software packages, proprietary software programs, etc., may be utilized for any of the components illustrated in FIG. 2. Therefore, the invention is not limited to the particular implementation disclosed herein.

Figure 3:
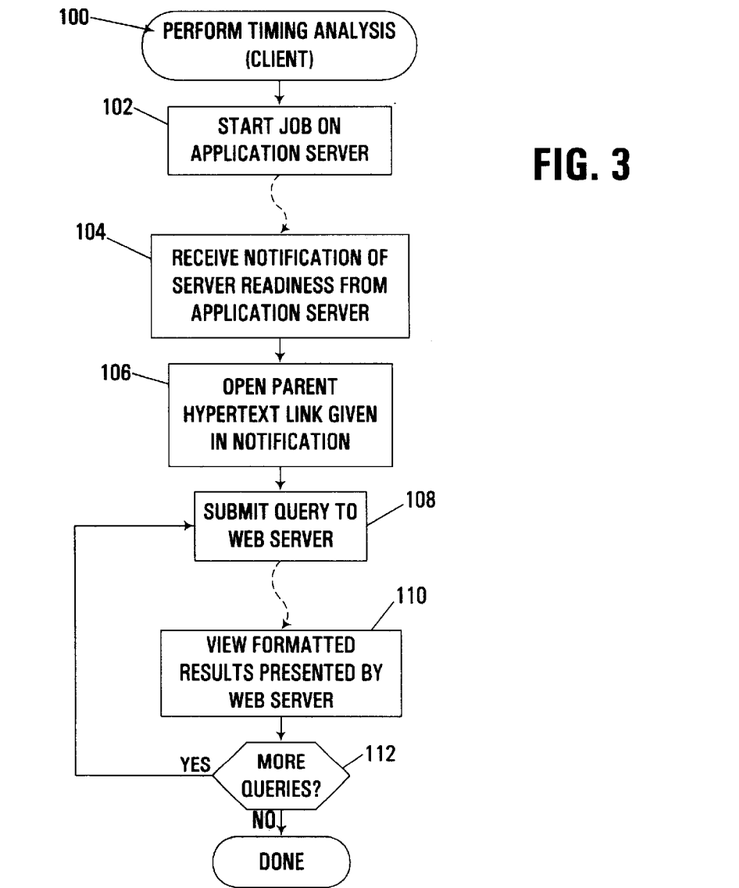
FIG. 3 is a flowchart illustrating the sequence of operations performed by a client to implement interactive client-server based timing analysis on the networked computer system of FIG. 1.

Referring now to both FIG. 2 and FIG. 3, the initiation of an interactive client-server based timing analysis session is illustrated from the client's perspective in routine 100 of FIG. 3. To initiate a timing analysis session, the client attempts to start the job on the application server in block 102. Sometime thereafter, the application server returns an initial notification message to the messaging client in block 104, indicating that the server is ready to interact with the client. Once the client receives the notification from the application server, the client opens a parent hypertext link given in the notification message in block 106. In particular, given that an HTTP-based interface is provided between client 12 and web server 62, typically the user is provided with a hypertext link to a uniform resource locator (URL) address for a hypertext markup language (HTML) document through which a user is permitted to interact with the timing analysis engine. As such, providing the hypertext link to the document in the notification message facilitates the user displaying the appropriate document in the web browser for immediate interaction with the timing analysis engine. In other implementations, block 106 may be omitted, or the user may be required to retrieve an appropriate document from web server 62 via other mechanisms.

Once the appropriate document has been served to the client web browser 66 by web server 62, the user is permitted to submit queries to the web server, as illustrated at block 108. As illustrated in FIG. 2, commands are passed to the timing analysis engine via queries issued by the web browser 66 to web server 62, which in turn results in the generation of one or more commands to application server 56 for controlling timing analysis engine 58. Timing data generated in response to such commands are returned as responses by application server 56 to web server 62. Then, as will be discussed in greater detail below, web server 62 reformats the data provided in the responses in an HTML document format, providing the response to web browser 66 for appropriate display on the client computer. Thus, returning to FIG. 3, the results of queries are returned to the client in a formatted manner by web server 62, as illustrated in block 110. If the user wishes to issue more queries, block 112 then returns control to block 108 to permit the user to submit additional queries. Once the user has no additional queries to submit, the session is complete, and routine 100 is terminated.

Returning again to FIG. 2, it may be desirable in some implementations to implement security precautions to ensure only authorized parties are permitted to control access the timing data generated by the timing analysis engine. In the illustrated implementation, this is implemented using a secure file system such as AFS or DFS, whereby users are required to provide a user ID and password to access specific data. Such data is provided in the form of keys, which are created by application server 56 and stored in a key file 74. Authentication is handled by web server 62 by performing authority checks with the data in key file 74. The specific steps in authenticating access are described below. In other implementations, however, no security provisions may be made.

Figure 4:
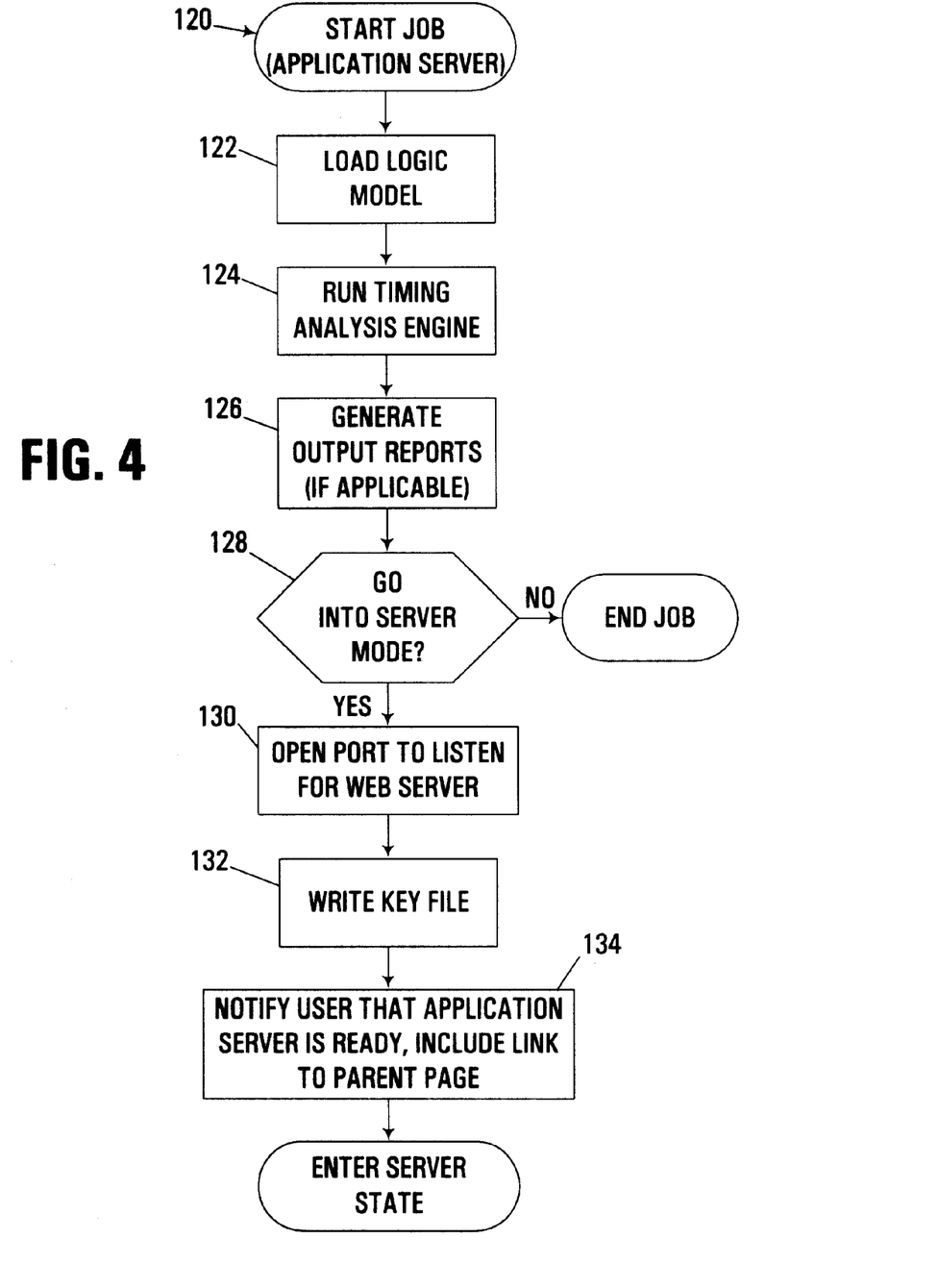
FIG. 4 is a flowchart illustrating the program flow of a start job routine executed by the application server of FIG. 1.

Now turning to FIG. 4, the operations performed by application server 56 in responding to a start job request by the client are illustrated by a start job routine 120. Routine 120 begins in block 122 by loading the logic model to be analyzed by the timing analysis engine. Next, in block 124, the timing analysis engine is run on the logic model. Then, if the commands issued to the timing analysis engine result in the generation of output data, suitable output reports are generated in block 126. Next, in block 128, it is determined whether the commands provided when the application server was launched specify that the application server enter a "server" mode whereby interactive communication with the timing analysis engine is supported. If not, the operations performed with the timing analysis engine operate much as a batch job, and as such, block 128 simply terminates routine 120 upon completion of block 126.

If, however, the user has requested an interactive session, block 128 passes control to block 130 to open a port or socket to listen for communications from the web server, in a manner known in the art. Next, block 132 writes a new key to the key file authorizing the user to access the timing data generated in block 126. Next, block 134 notifies the user that the application server is ready to perform an interactive session. Included within the notification message is a link to the parent page through which the user is permitted to interact with the application server via the web server. Upon completion of block 134, the application server enters the "server"mode or state.

As discussed above with reference to FIG. 3, after the client receives the notification of server readiness, the client will next open the parent page, by selecting a hypertext link in the notification message which results in the generation of an appropriate HTTP-compatible request to web server 62. The web server then serves the appropriate page back to the client computer such that an appropriate interactive screen is displayed to the user. Thereafter, the user submits queries to the web server which are passed along to the application server to perform the requested activities with the timing analysis engine.

Figure 5:
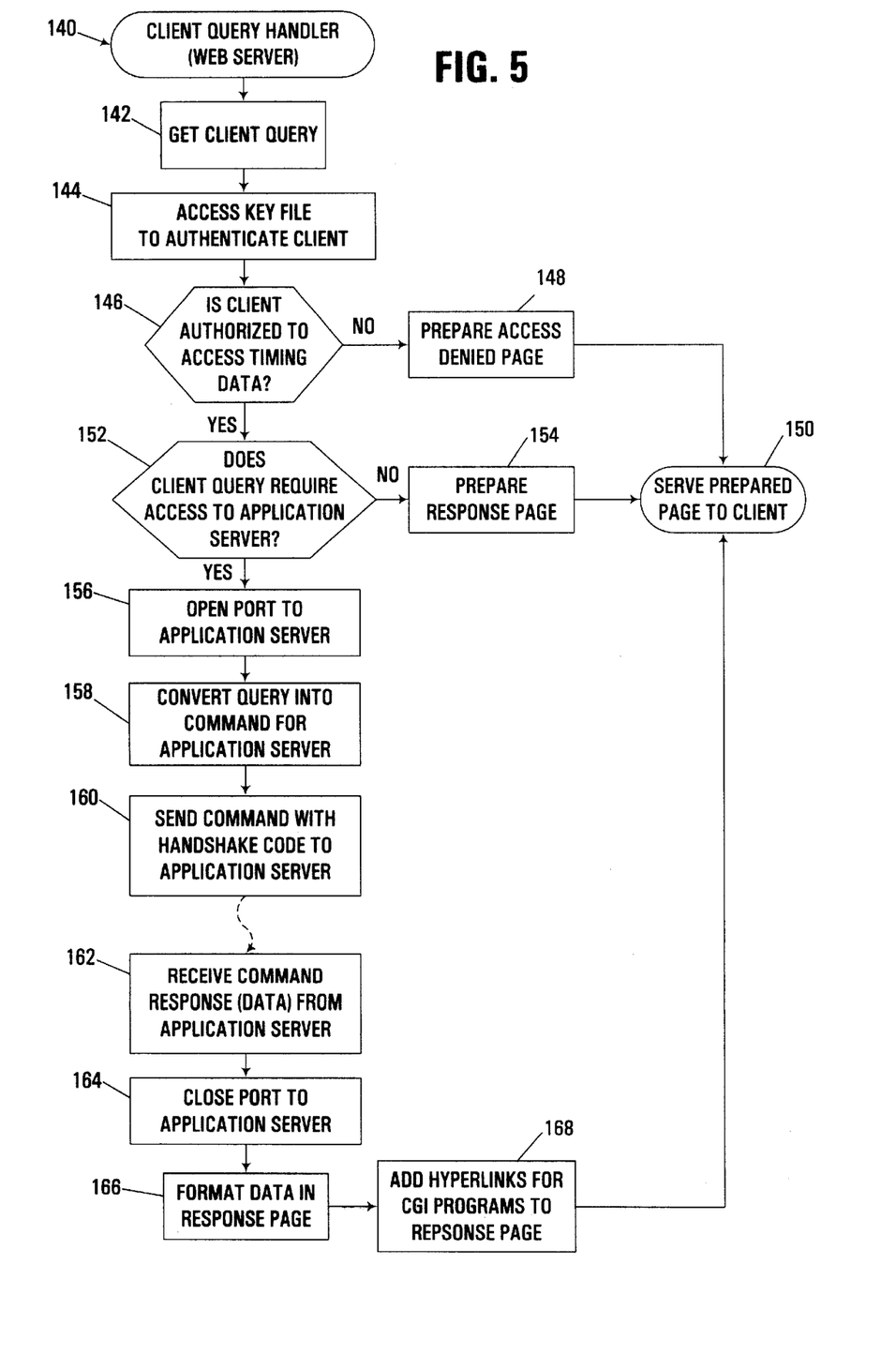
FIG. 5 is a flowchart illustrating the program flow of a client query handler routine executed by the web server of FIG. 1.

FIG. 5 illustrates a client query handler routine 140 executed by the web server in response to queries issued by the user. In block 142, the client query is obtained, and in block 144, the key file is accessed to authenticate the client. To do so, the client query includes appropriate client identification and authentication information, e.g., the name of the key file. In response, the web server typically initiates an authentication procedure with the client as is well known in the art.

Next, block 146 determines whether the client is authorized to access the requested timing data. If not, control passes to block 148 to prepare an access denied page that indicates to the user that the client computer is not authorized to access the requested data. Control then passes to block 150 to serve the prepared page to the client and thereby notify the client of the denial of access.

Returning to block 146, if the client is authorized to access the timing data, control passes to block 152 to determine whether the client query requires access to the application server. As is known in the art, the web server may access other sources of information, e.g., an internal intranet or the public Internet, and as such, for such other information sources, control would pass to block 154 to prepare the response page in a manner known in the art. Control then returns to block 150 to serve the prepared page to the client.

If the client query does require access to the application server, however, control passes from block 152 to block 156 to open the port to the application server. Next, block 158 converts the query into one or more commands for the application server. In the illustrated implementation, the conversion of the query is performed by executing one of a plurality of predefined CGI-BIN scripts available to the web server. CGI-BIN scripts are formatted using the timing parameters and other options specified by the user on the parent page, which are integrated into the scripts in a manner known in the art. Once the query has been converted, control then passes to block 160 to send the command or commands with an appropriate handshake code to the application server. Sometime thereafter, the command response, typically including timing data, is received from the application server in block 162. Next, in block 164, the port to the application server is closed, and in block 166 the data returned in the response is formatted into an appropriate response page, e.g., utilizing conventional HTML formatting. In addition, as shown in block 168, it may also be desirable to add hypertext links within the response page that point to specific CGI scripts to perform other activities with the timing analysis engine. For example, hypertext links could be provided to permit a user to change timing parameters, rerun timing analysis operations with different timing parameters, edit a logic design, edit a physical design, access detailed reports, graphical reports, or other reports related to hyperlinked items in another report. By providing such hypertext links on the response page, user interaction with the timing analysis server is greatly facilitated, as the user may not be required to search through a command structure to locate relevant commands to perform different operations. Rather, the commands that are most likely to be used by a user may be added to the response page such that a user is capable of performing a wide variety of activities simply through selecting different options on the response page itself.

Once the hypertext links have been added to the response page, control passes to block 150 to serve the response page to the client. Routine 140 is then complete.

Figure 6:
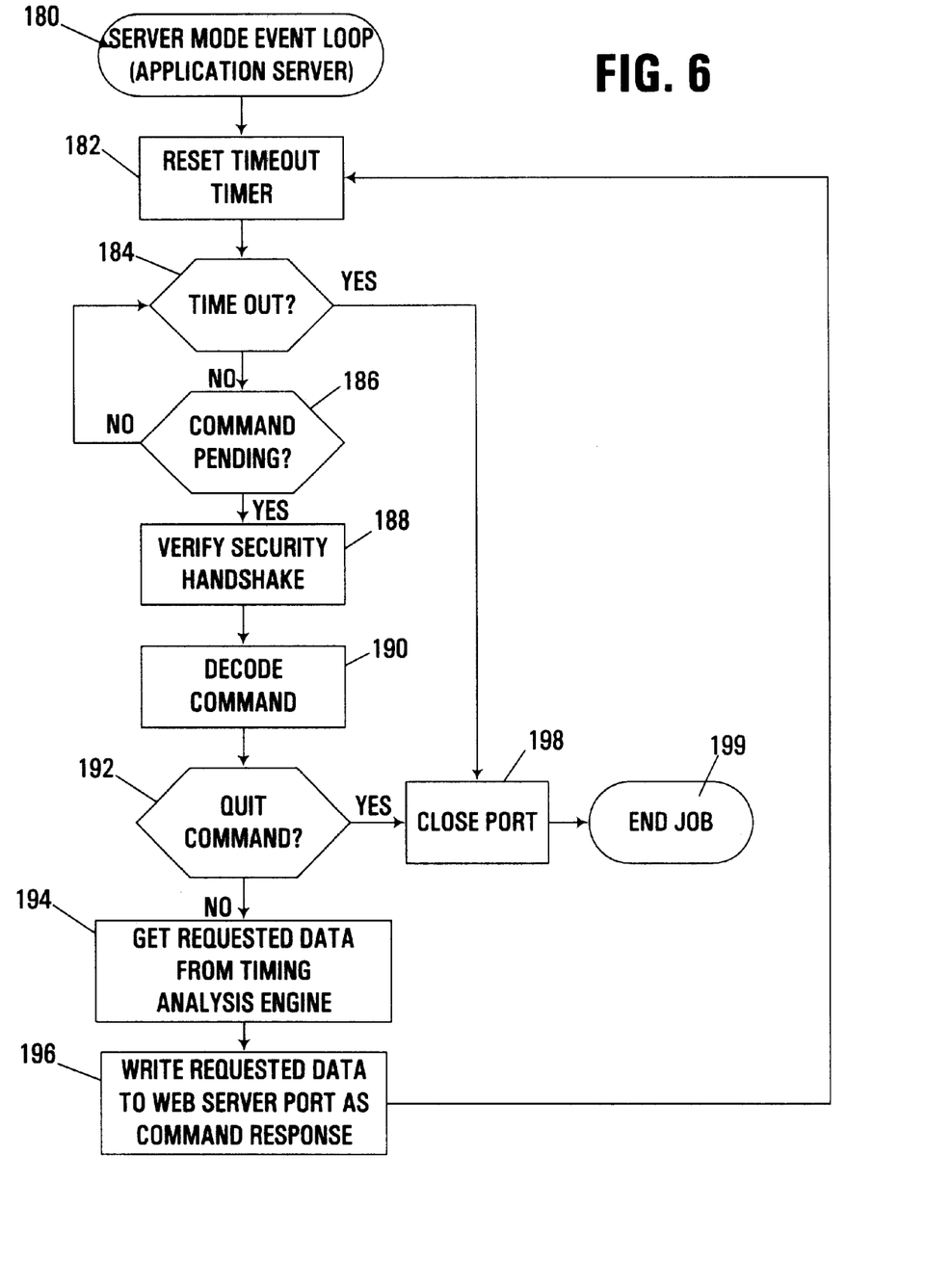
FIG. 6 is a flowchart illustrating the program flow of a server mode event loop routine executed by the application server of FIG. 1.

FIG. 6 next illustrates the interaction between the web server and the application server from the viewpoint of the application server during a service mode event loop, as illustrated by routine 180. Routine 180 is executed after the application server has entered the "server" mode or state, and is ready to receive commands from clients via the web server. Routine 180 begins in block 182 by resetting a time out timer that functions as a watch dog to automatically shut down the application server after a client has terminated a session. Block 182 passes control to block 184 to determine whether the time out timer has expired. If not, control passes to block 186 to determine whether any commands are pending from the web server. If not, control returns to block 184 to wait for new commands.

Once a command is received, control passes to block 188 to verify the security handshake provided in the command sent by the web server. Any number of conventional handshaking mechanisms may be utilized to ensure authorized access to the timing data generated by the timing analysis engine. For example, a security handshake such as common access by both the web server and application server to a common key file on a secure distributed file system such as AFS (Andrew File System), DFS (Distributed File System) or NFS (Network File System) may be used in the illustrated embodiment. Note that the client typically does not need access to the key file. The web server through normal configuration may request authentication from a client to allow access to secure files from the file system.

Once the security handshake has been verified, control passes to block 190 to decode the command received from the web server. Assuming first that the command is other than a quit command, block 192 passes control to block 194 to interact with the timing analysis engine to retrieve the requested data. Block 194 may also send additional commands to the timing analysis engine, e.g., to modify timing parameters or options, to rerun timing analysis under different circumstances, to edit the logic design, etc. Once block 194 is complete, block 196 writes the requested data to the web server port as a response to the command. Control then returns to block 182 to reset the time out timer and wait for additional commands.

Returning to block 192, if a quit command is received, control passes to block 198 to close the port, and then to block 199 to end the current job. In addition, returning to block 184, if a time out does occur, control passes to block 198 to close the port and terminate the job.

It will be appreciated that innumerable operations may be performed with timing analysis engine 58 using the above-described interactive client-server based environment, including any operation supported by the engine through its programmatic interface. Moreover, any number of user interface techniques supported by HTML and/or any other known display protocol or programming interface may be implemented in the documents served to browser 66 to enhance or otherwise facilitate interaction with the timing analysis server.

Furthermore, in addition to interacting with a timing analysis engine, the above-described interactive client-server based environment may also support interaction with other electronic design automation (EDA) tools, e.g., to edit the logic design, edit a physical design, run other verification tools, etc. As an example, when timing analysis server 58 is integrated into an EDA package, the same scripting protocol may be supported across multiple tools in the package. The aforementioned interactive environment would therefore permit access to other tools using the same basic infrastructure.

Figure 7:
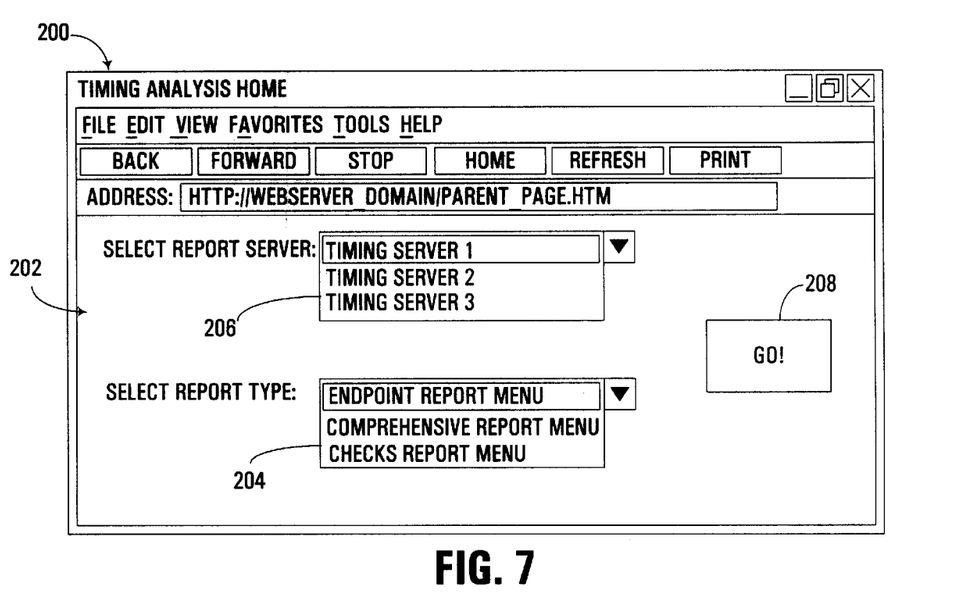
FIG. 7 is a block diagram of a browser window generated by the browser of FIG. 1 when displaying a parent page.
Figure 8:
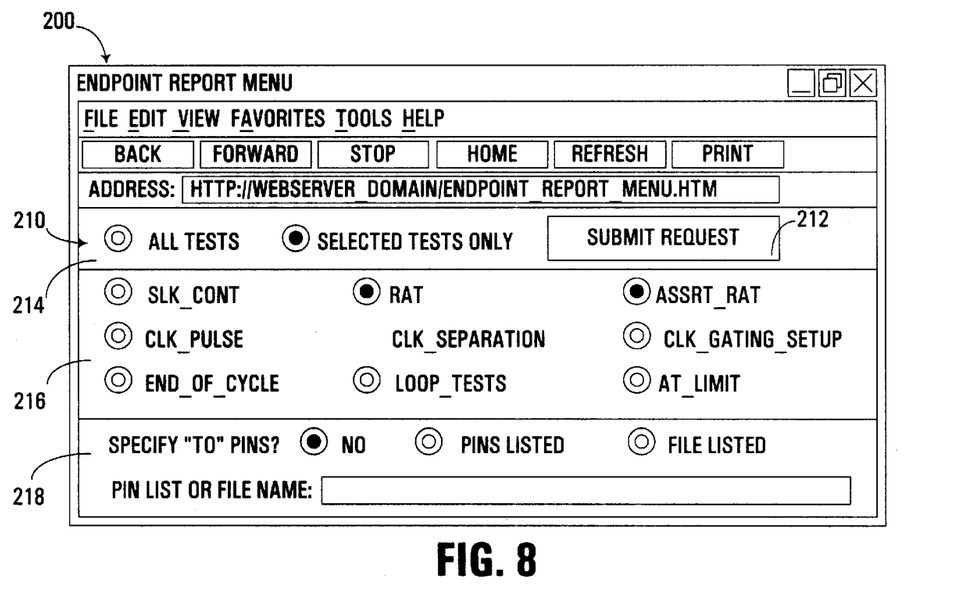
FIG. 8 is a block diagram of a browser window generated by the browser of FIG. 1 when displaying a report menu page.
Figure 9:
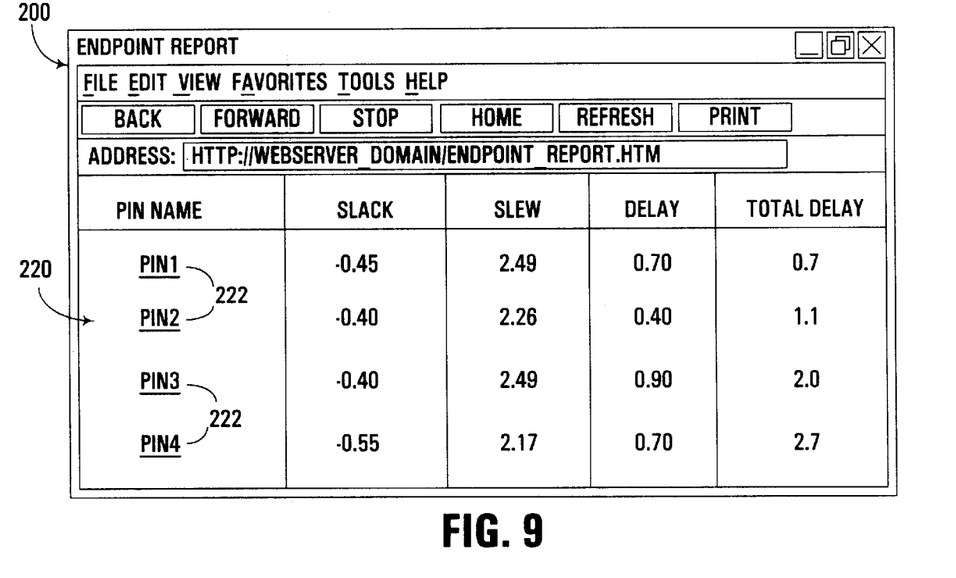
FIG. 9 is a block diagram of a browser window generated by the browser of FIG. 1 when displaying a report page.

To further illustrate the interaction of a user or client with a timing analysis engine consistent with the invention, FIGS. 7–9 illustrate a number of HTML-based documents displayed in a browser window 200 during an interactive session. As shown in FIG. 7, for example, a parent page 202 may be displayed in window 200. As discussed above, a hypertext link is typically provided in the initial notification message to the client once a job is started on the application server. Page 202 is one suitable representation of a page or document that may be displayed to a client in response to selection of such a hypertext link. Parent page 202 operates as a main or home page from which a client can access a multitude of report types, e.g., through selection of a desired report type from a list box graphical user interface element 204. In addition, if multiple timing servers are supported in an environment, a client may also be permitted to select a specific server from a list of servers identified in a list box graphical user interface element 206.

Multiple timing servers may be used, for example, to implement multiple timing models on a single logic design. Multiple timing servers may also be used to implement timing models for multiple logic designs. Selection of a timing server therefore typically provides a network address for the associated application server to which requests should be forwarded.

Once appropriate selections are made, user selection of a "GO" button 208 invokes a CGI-BIN script associated with that button that takes the selections in elements 204 and 206 and calls appropriate program code to generate a report menu page for the requested menu, and for the requested server. Typically, the CGI-BIN script run upon selection of button 208 would be configured to call a report-specific CGI-BIN script based upon the selection in list box 204.

Upon execution of a report-specific CGI-BIN script, a report menu page, e.g., page 210 of FIG. 8, may be generated. Page 210 illustrates a portion of a menu page that may be suitable for selecting timing parameters and other options for creating an endpoint report, the use and configuration of which is known in the art. As shown in FIG. 8, report menu page 210 may include various radio button groups 214, 216 from which a user specifies the particular tests to be run on a given logic design. Also shown is an input group 218 from which a user specifies which "to" pins should be specified. A wide variety of timing parameters and options may be selected in the manner disclosed herein, e.g., the types of timing tests of interest to the user (setups, holds, etc.), whether to trace and report paths in forward or reverse order, slack threshold for reporting timing tests, number of decimal places of accuracy in reported values, new physical location, new cell binding for a gate, etc.

Once a client specifies timing parameters, the client initiates a query to generate the requested report by selecting a "submit request" button 212 embedded in page 210. Selection of such a button invokes a CGI-BIN script to retrieve the parameters and options selected by the client, issue appropriate commands to the application server, retrieve the resulting timing data and format the data in an HTML-compatible format suitable for display on browser 66. One suitable implementation of such a report is illustrated by report page 220 of FIG. 9.

As discussed above, another benefit of the aforementioned environment is that hypertext links may be embedded in report pages to facilitate further user interaction with the timing analysis server. As an example, for page 220, each pin label 222 in the report may be designated as a hypertext link that is associated with another CGI-BIN script that interacts with the application server to request a relevant report for that pin. For example, selection of a pin label 222 may result in the generation of a more comprehensive report associated with the timing data for that pin. Practically any command or set of commands may be issued to the application server through the use of such embedded hypertext links.

The illustrated environment provides a number of advantages over conventional designs. The environment may be to support live, interactive querying of timing data for multiple clients, which facilitates collaborative verification of a logic design. Further, when HTML, HTTP, CGI-BIN and TCL protocols are utilized as described herein, a substantial portion of the program code may rely on commercially-available software packages, and the clients may be platform independent. Moreover, conventional security protocols may be used to provide authentication of users and to limit unauthorized access to the timing analysis engine and generated timing data. Also, through the use of the Internet and/or a wide area network (WAN), multiple users may collaboratively utilize the environment despite geographic separation.

An efficient, simple and well-known hypertext-based user interface may also be supported, thereby simplifying user interaction. Further, by using embedded hypertext links, context-sensitive report generation and other relevant commands may be made available to clients in connection with the presentation of timing data. Commands may also be supported for modifying the timing model, as well as the underlying logic or physical model, layout information, etc., through the same interface if desired. User interaction is also facilitated through automated notification of users and automated shutdown when inactive.

Additional functions may also be supported consistent with the invention. For example, to facilitate debugging of large designs by teams of designers, it may be desirable for an application server to be activated to receive client queries during remote or batch timing runs whenever the run reaches a point where debugging may take place. The notification feature and the ability to run the process on a remote machine facilitate this operation.

It may also be desirable in some implementations to persistently store modifications to the timing model, timing environment, constraints, and/or parameters, as well as logic edit requests, physical edit requests, etc., and to permit such persistently stored information to be retrieved at a future time.

In addition, while hypertext links are used in the illustrated embodiments to provide interactivity within the timing reports, it will be appreciated that any number of other interactive elements, e.g., various known GUI controls and the like, may be utilized to generate additional context-sensitive client queries consistent with the invention.

Other modifications will be apparent to one of ordinary skill in the art. Therefore, the invention lies in the claims hereinafter appended.

What is claimed is:

1. An apparatus, comprising at least one computer configured to execute a timing analysis program and an interactive request server program, wherein:
    (a) the timing analysis program is configured to generate timing data for a logic model representative of a circuit design; and
    (b) the interactive request server program is interfaced with the timing analysis program and configured to receive client requests from a plurality of client computers over a network to access the timing data for the logic model, and, in response to each client request, access the timing analysis program to retrieve timing data based upon such client request and thereafter forward the timing data to the client computer making such request.

2. The apparatus of claim 1, wherein the interactive request server program includes a web server program configured to execute a script in response to a client request supplied to the web server, wherein the script includes at least one command issued by the web server, wherein the timing analysis program includes a programmatic interface, and wherein the interactive request server program further includes an application server program interfaced with the timing analysis program, the application server program configured to receive the command from the web server program and control the timing analysis program using the programmatic interface responsive thereto.

3. The apparatus of claim 2, wherein the client request comprises a hypertext transfer protocol (HTTP) request, wherein the script comprises a common gateway interface (CGI) program, wherein the timing analysis program is responsive to Tool Control Language (TCL) commands, and wherein the CGI program includes at least one TCL command to be executed on the timing analysis program.

4. The apparatus of claim 2, wherein the apparatus comprises first and second computers coupled to one another over a network, wherein the application server program is executed by the first computer and the web server program is executed by the second computer.

5. The apparatus of claim 1, wherein the interactive request server program is configured to check authorization for a client computer prior to forwarding timing data thereto.

6. The apparatus of claim 1, wherein the interactive request server program is configured to automatically notify a client when the interactive request server program is ready to receive client requests.

7. The apparatus of claim 1, wherein the interactive request server program is configured to modify a timing parameter in response to a client request.

8. The apparatus of claim 1, wherein the interactive request server program is configured to modify the logic model in response to a client request.

9. The apparatus of claim 1, further comprising a second timing analysis program interfaced with the interactive request server program, wherein the interactive request server program is configured to selectively route client requests to the second timing analysis program.

10. The apparatus of claim 9, wherein the second timing analysis program is configured to generate timing data for the same logic model as the first timing analysis program but using different timing parameters.

11. The apparatus of claim 1, wherein the interactive request server program is configured to format the timing data retrieved from the timing analysis program by embedding the timing data in a hypertext markup language (HTML) document.

12. The apparatus of claim 11, wherein the interactive request server program is further configured to embed a hypertext link into the HTML document, wherein, in response to user selection of the hypertext link, the interactive request server program is configured to issue a second client request to the timing analysis program.

13. The apparatus of claim 1, wherein the interactive request server program is further configured to embed an interactive element into the timing data such that, upon user selection of the interactive element, the interactive request server program is configured to issue a second client request to the timing analysis program.

14. An apparatus for use in interfacing a plurality of client computers with a timing analysis program, the timing analysis program configured to generate timing data for a logic model representative of a circuit design, the apparatus comprising at least one computer executing a web server program and an application server program, wherein:
  (a) the web server program is configured to receive a hypertext transfer protocol (HTTP) request from one of the plurality of client computers, and in response thereto, to execute a script, the script including at least one command configured to be transmitted by the web server program to the application server program to control the timing analysis program;
  (b) the application server program is interfaced with the timing analysis program and configured to receive the command, and in response thereto, to access the timing analysis program to retrieve timing data based upon such command and thereafter forward the timing data to the web server; and
  (c) the web server program is further configured to receive the timing data from the application server program, generate therefrom a hypertext markup language (HTML) document including the timing data, and transmit the HTML document to the client computer issuing the HTTP request.

15. The apparatus of claim 14, wherein the command comprises a Tool Control Language (TCL) command, and wherein the script comprises a Common Gateway Interface (CGI) program including the TCL command.

16. The apparatus of claim 14, wherein the web server program is further configured to embed a hypertext link into the HTML document, the hypertext link associated with a second script, the second script including a second command for performing an operation with the timing analysis program.

17. A program product, comprising:
  (a) a first program configured to interface a plurality of client computers with a second, timing analysis program that generates timing data for a logic model representative of a circuit design, the first program further configured to receive client requests from a plurality of client computers over a network to access the timing data for the logic model, and, in response to each client request, access the timing analysis program to retrieve timing data based upon such client request and thereafter forward the timing data to the client computer making such request; and
  (b) a signal bearing medium bearing the first program.

18. The program product of claim 17, wherein the signal bearing medium includes at least one of a transmission medium and a recordable medium.

19. A method of accessing a timing analysis program that generates timing data for a logic model representative of a circuit design, the method comprising:
  (a) receiving client requests over a network from a plurality of client computers; and
  (b) in response to each client request, accessing the timing analysis program to retrieve timing data based upon such client request, and thereafter forwarding the timing data to the client computer making such request.

20. The method of claim 19, wherein the timing analysis program includes a programmatic interface, the method further comprising:
  (a) executing a script on a first server program in response to a client request, the script including at least one command; and
  (b) transmitting the command to a second server program in response to execution of the script;
wherein accessing the timing analysis program includes receiving the command from the first server program and controlling the timing analysis program using the programmatic interface responsive thereto.

21. The method of claim 20, wherein receiving the client request includes receiving a hypertext transfer protocol (HTTP) request, wherein the script comprises a common gateway interface (CGI) program, wherein the timing analysis program is responsive to Tool Control Language (TCL) commands, and wherein the CGI program includes at least one TCL command to be executed on the timing analysis program.

22. The method of claim 20, wherein the first and second server programs are executed on separate computers coupled to one another over a network.

23. The method of claim 19, further comprising checking authorization for a client computer prior to forwarding timing data thereto.

24. The method of claim 19, further comprising automatically notifying a client when ready to receive client requests.

25. The method of claim 19, further comprising modifying a timing parameter in response to a client request.

26. The method of claim 19, further comprising modifying the logic model in response to a client request.

27. The method of claim 19, further comprising:

(a) receiving a client request to access a second timing analysis program; and (b) accessing the second timing analysis program in response to such client request to access the second timing analysis program.

28. The method of claim 27, wherein the second timing analysis program is configured to generate timing data for the same logic model as the first timing analysis program but using different timing parameters.

29. The method of claim 19, further comprising formatting the timing data retrieved from the timing analysis program by embedding the timing data in a hypertext markup language (HTML) document.

30. The method of claim 29, further comprising:

(a) embedding a hypertext link into the HTML document; and (b) in response to user selection of the hypertext link, issuing a second client request to the timing analysis program.

31. The method of claim 19, further comprising:

(a) embedding an interactive element into the timing data; and (b) upon user selection of the interactive element, issuing a second client request to the timing analysis program.

* * * * *